United States Patent
Lee

(10) Patent No.: US 7,981,752 B2
(45) Date of Patent: Jul. 19, 2011

(54) METHOD OF FORMING JUNCTION OF SEMICONDUCTOR DEVICE

(75) Inventor: Dong Ho Lee, Seongnam-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 231 days.

(21) Appl. No.: 12/258,269

(22) Filed: Oct. 24, 2008

(65) Prior Publication Data

US 2009/0111233 A1 Apr. 30, 2009

(30) Foreign Application Priority Data

Oct. 26, 2007 (KR) .................. 10-2007-0108164

(51) Int. Cl.
*H01L 21/336* (2006.01)
(52) U.S. Cl. ............................... 438/308; 257/E21.425
(58) Field of Classification Search .......... 438/197–201, 438/301–308; 257/E21.425
See application file for complete search history.

(56) References Cited

U.S. PATENT DOCUMENTS

| 6,569,728 B2 | 5/2003 | Lee et al. | |
| 2006/0154411 A1* | 7/2006 | Bu et al. ..................... | 438/184 |

FOREIGN PATENT DOCUMENTS

| KR | 1020040007024 A | 1/2004 |
| KR | 1020050002316 A | 1/2005 |
| TW | 461024 | 10/2001 |

OTHER PUBLICATIONS

Downey et al., Dose-rate effects on the formation of ultra-shallow junction with low-energy B+ and BF2+ ion implants, Thin Solid Films, vol. 308-309, pp. 562-569, (1997).*

* cited by examiner

*Primary Examiner* — Brook Kebede
(74) *Attorney, Agent, or Firm* — Kilpatrick Townsend & Stockton LLP

(57) ABSTRACT

The present invention relates to a method of forming junctions of a semiconductor device. According to the method of forming junctions of a semiconductor device in accordance with an aspect of the present invention, there is provided a semiconductor substrate in which a transistor including the junctions are formed. A first thermal treatment process for forming a passivation layer over the semiconductor substrate including the junctions is performed. Here, the passivation layer functions to prevent impurities within the junctions from being drained. A pre-metal dielectric layer is formed over the semiconductor substrate including the passivation layer.

34 Claims, 2 Drawing Sheets

METHOD OF FORMING JUNCTION OF SEMICONDUCTOR DEVICE

CROSS-REFERENCES TO RELATED APPLICATIONS

The present application claims priority to Korean patent application number 10-2007-0108164, filed on Oct. 26, 2007, which is incorporated by reference in its entirety.

BACKGROUND OF THE INVENTION

The present invention relates to a semiconductor device and, more particularly, to a method of forming semiconductor junctions, which can prohibit an increase in the resistance of the junctions.

A semiconductor device includes a plurality of transistors. The transistors are electrically connected through metal lines. Each transistor generally comprises of a gate electrode and two source/drain junctions.

The junctions can be formed by performing an ion implantation process. The ion implantation process can be performed using different types of impurities according to the type of transistor to be formed. The characteristics of a junction can vary depending on the conditions of the ion implantation process. In particular, after the ion implantation process is performed, the implanted impurities are activated. The activation process is generally performed using a thermal treatment process.

As the level of integration of semiconductor devices continues to grow, the depth of a junction needs to become shallow. This type of junction is called an ultra-shallow junction. The ultra-shallow junction is formed by using a very low energy. If a very low energy is applied as described above, impurities generally exist near the surface of a semiconductor substrate. After an impurity activation process is carried out, a pre-metal dielectric layer is formed to cover both the gate and the junctions. After the pre-metal dielectric layer is formed, subsequent thermal treatment processes are performed several times. Here, the impurities formed near the surface of the semiconductor substrate can diffuse into the pre-metal dielectric layer and then be drained (i.e., removed) out of the junctions. As described above, if the impurities are drained from the junction, sheet resistance of the junction can increase.

BRIEF SUMMARY OF THE INVENTION

The present invention relates to a method to prevent impurities within junctions from being drained during a thermal treatment process. After the impurities are implanted by performing an ion implantation process, an activation process is performed using a first thermal treatment process and a second thermal treatment process, wherein the first thermal treatment process is performed in $N_2$ ambient (heating) and $NH_3$ ambient (cooling) and the second thermal treatment process is performed in $N_2$ ambient (heating and cooling).

According to a method of forming junctions of a semiconductor device in accordance with an aspect of the present invention, there is provided a semiconductor substrate in which a transistor including the junctions are formed. A first thermal treatment process for forming a passivation layer over the semiconductor substrate including the junctions is performed. Here, the passivation layer functions to prevent impurities within the junctions from being drained. A pre-metal dielectric layer is formed over the semiconductor substrate including the passivation layer.

According to a method of forming junctions of a semiconductor device in accordance with another aspect of the present invention, there is provided a semiconductor substrate in which a transistor including the junctions are formed. A first thermal treatment process for forming a passivation layer, including silicon nitride, over the semiconductor substrate including the junctions is performed. A pre-metal dielectric layer is formed over the semiconductor substrate including the passivation layer.

According to a method of forming junctions of a semiconductor device in accordance with still another aspect of the present invention, there is provided a semiconductor substrate in which a transistor including the junctions are formed. A first thermal treatment process for forming a passivation layer on the junctions is performed. A second thermal treatment process for improving electrical characteristics of the junctions is performed. A pre-metal dielectric layer is formed over the semiconductor substrate including the passivation layer.

The first thermal treatment process can be performed using a rapid thermal processing (RTP). The RTP can include sequentially performing a step-up process and a cooling process.

The step-up process can include raising a temperature within a chamber with a step of 50 to 150 degrees Celsius/sec while supplying $N_2$ gas to the chamber.

The step-up process can include raising a temperature within a chamber up to 200 to 500 degrees Celsius while supplying $N_2$ gas to the chamber. Here, the $N_2$ gas can be supplied at a flow rate of 1 to 40 slpm.

The cooling process can include cooling a temperature within a chamber to 20 to 100 degrees Celsius/sec while supplying $NH_3$ gas to the chamber. Here, the $NH_3$ gas can be supplied at a flow rate of 1 to 10 slpm.

The passivation layer is formed from a layer including Si—N. The second thermal treatment process can be performed using a spike RTP.

The spike RTP can include raising a temperature within a chamber up to 1000 to 1100 degrees Celsius with a step of 150 to 250 degrees Celsius, while supplying $N_2$ gas to the chamber at a flow rate of 1 to 40 slpm.

The spike RTP can include cooling the temperature within the chamber in $N_2$ ambient. The second thermal treatment process can be performed using a RTP.

The RTP comprises sequentially performing a step-up process and a cooling process. The step-up process can include forming $N_2$ ambient within a chamber and raising a temperature within the chamber with a step of 50 to 80 degrees Celsius/sec.

The step-up process can include raising a temperature within a chamber up to 750 to 850 degrees Celsius in $N_2$ gas ambient. Here, the $N_2$ gas can be supplied at a flow rate of 1 to 40 slpm. The cooling process can be performed by forming $NH_3$ ambient within a chamber.

The RTP can be performed using a soak type RTP apparatus, a laser type RTP apparatus or a flash type RTP apparatus, or a combination of the soak type RTP apparatus, the laser type RTP apparatus and/or the flash type RTP apparatus. When the soak type RTP apparatus can be used, a temperature within a chamber can be reached up to 900 to 1000 degrees Celsius. When the laser type RTP apparatus or the flash type RTP apparatus can be used, a temperature within a chamber can be reached up to 1200 to 1400 degrees Celsius and then cooled. At the time of a cooling process of the second thermal treatment process, $N_2$ ambient can be formed within a chamber.

The junctions can be formed by implanting a P-type impurity into the semiconductor substrate. The impurity can employ 11B or 49BF$_2$ ion.

When the 11B ion can be used, energy of 5 KeV to 1 eV can be applied. When the 49BF$_2$ ion can be used, energy of 20 KeV to 1 eV can be applied.

The ion implantation process can include implanting the impurity with a dose of $1\times10^{15}$ ions/cm$^2$ to $3\times10^{15}$ ions/cm$^2$. The pre-metal dielectric layer can be formed by stacking a middle temperature oxide (MTO) layer and a boro-phosphosilicate glass (BPSG) layer.

DESCRIPTION OF SPECIFIC EMBODIMENTS

A specific embodiment according to the present invention will be described with reference to the accompanying drawings. However, the present invention is not limited to the disclosed embodiment, but may be implemented in various manners. The embodiment is provided to complete the disclosure of the present invention and to allow those having ordinary skill in the art to understand the scope of the present invention. The present invention is defined by the category of the claims.

FIGS. 1A to 1D are sectional views illustrating a method of forming junctions of a semiconductor device in accordance with the present invention. An example of forming junctions in a DRAM device is described below in connection with an embodiment.

Figure 1A:
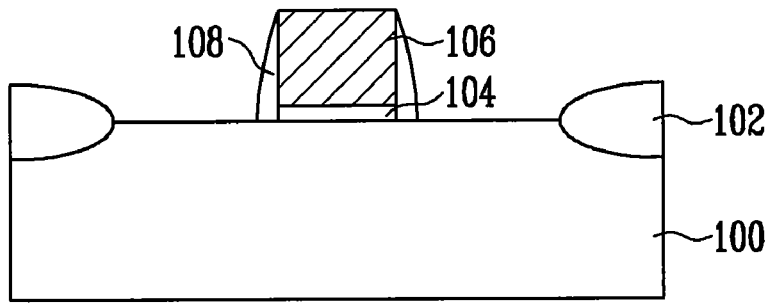
FIGS. 1A to 1D are sectional views illustrating a method of forming junctions of a semiconductor device in accordance with the present invention.

In FIG. 1A, a semiconductor substrate 100 in which isolation layers 102 are formed in an isolation region is provided. In one embodiment, the isolation layers 102 are replaced with isolation structures formed within shallow trenches, e.g., using a shallow trench isolation method. A dielectric layer and an electrode layer are formed on the exposed semiconductor substrate 100 and the isolation layers 102. A patterning process is performed for the gate electrode patterns, thus exposing parts of the isolation layers 102 and the semiconductor substrate 100 to create a gate dielectric layer 104 and a gate electrode 106. A spacer layer 108 is formed on the sidewalls of the gate dielectric layer 104 and the gate electrode 106. Here, before the spacer layer 108 is formed, an ion implantation process may be performed on the exposed semiconductor substrate 100 in order to form an ion implantation region (not shown).

Figure 1B:
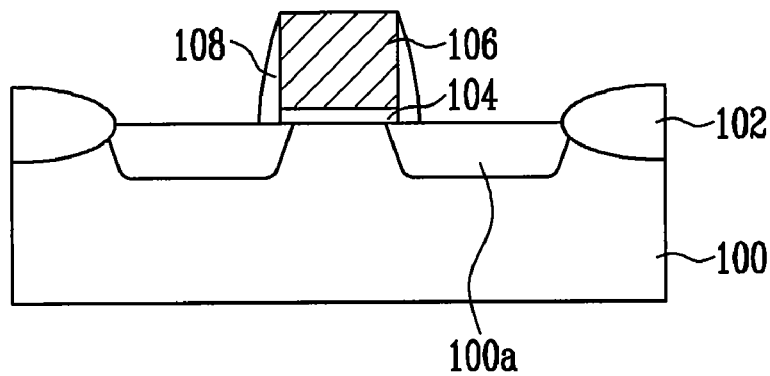

Referring to FIG. 1B, an ion implantation process is performed in order to form junctions 100a in the semiconductor substrate 100 on each side of the gate electrode 106. If the ion implantation region (not shown) is formed in FIG. 1A, an ion implantation process can be performed as follows in order form the junctions 100a.

An ion implantation process can be performed using an ion implantation apparatus of high-current and low energy in order to implant a P-type impurity. For example, the impurity can be 11B or 49BF$_2$ ion. Here, low ion implantation energy can be applied according to the higher integration of semiconductor devices. In one embodiment, in the case in which 11B ion is implanted, energy of 1 eV to 5 KeV is applied, e.g., no more than 2 KeV. In another embodiment, in the case in which 49BF$_2$ ion is implanted, energy of 1 eV to 20 KeV can be applied, e.g., no more than 10 KeV. In one embodiment, the impurities are implanted to a dosage (or concentration) of $1\times10^{15}$ ions/cm$^2$ to $3\times10^{15}$ ions/cm$^2$. Thus, the junctions 100a are formed in the semiconductor substrate 100 on both sides of the gate electrode 106, thus completing a transistor.

Figure 1C:
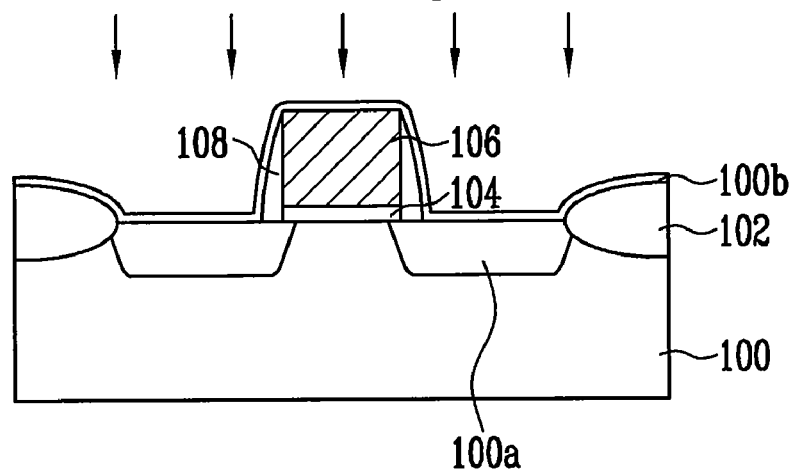

Referring to FIG. 1C, the impurity implanted into the junctions 100a is activated. The activation of the impurity can be performed using a thermal treatment process. The thermal treatment process is performed in such a way as to prevent the impurities implanted into the junctions 100a from being drained during a subsequent thermal process. In one embodiment, the thermal treatment process involves two steps: (1) a first thermal treatment process and (2) a second thermal treatment process. In another embodiment, the first thermal treatment process alone is performed. The first thermal treatment process and the second thermal treatment process are described below in more detail.

The first thermal treatment process involves a rapid thermal process (RTP). The RTP is carried out using a step-up process and a cooling process. More specifically, the step-up process can be performed by increasing the temperature incrementally, e.g., with an increment of 50 to 150 degrees Celsius/sec, while supplying N$_2$ gas to a chamber. In one embodiment, N$_2$ gas is supplied at a flow rate of 1 to 40 slpm (standard liter per minute). The temperature is increased until it reaches to a given temperature, e.g., 200 to 500 degrees Celsius, while supplying N$_2$ gas to the chamber. The cooling process is performed after the given temperature has been reached. The cooling process preferably should be performed immediately after the given temperature has been reached. During the cooling process the temperature is cooled 20 to 100 degrees Celsius/sec while supplying NH$_3$ gas to the chamber. NH$_3$ gas can be supplied at a flow rate of 1 to 10 slpm. In the cooling process, the inside of the chamber has NH$_3$ ambient gas, so a passivation layer 100b, including silicon nitride, is formed on the surface of the junctions 100a. The passivation layer 100b functions to prevent the impurity within the junctions 100a from being drained or diffused out of the junction 100a. The passivation layer 100b can be formed only on the top surface of the junctions 100a, but this requires an additional hard mask pattern. For this reason, in the present embodiment, the passivation layer 100b is formed on a top surface of the semiconductor substrate 100 including the junctions 100a. Here, the passivation layer 100b may also be formed in regions other than the junctions 100a.

The second thermal treatment process can be performed using a spike RTP. More specifically, N$_2$ gas is supplied into the chamber at a flow rate of 1 to 40 slpm. The temperature within the chamber can be raised up to 1000 to 1100 degrees Celsius with an increment of 150 to 250 degrees Celsius per second and then cooled in N$_2$ ambient. The second thermal treatment process improves the electrical characteristics of the junction 100a.

Alternatively, the second thermal treatment process can be performed in another manner as follows. More specifically, the second thermal treatment process can be performed using a RTP. The RTP can be performed using a step-up process and a cooling process sequentially. More specifically, the step-up process can be performed in N$_2$ ambient within a chamber and increasing the temperature with a step of 50 to 80 degrees Celsius/sec. In one embodiment, N$_2$ gas is supplied to the chamber at a flow rate of 1 to 40 slpm. Once the temperature within the chamber reaches to 750 to 850 degrees Celsius, the cooling process is carried out. The cooling process is performed in NH$_3$ ambient within the chamber in order to lower the temperature, so the passivation layer 100b, including silicon nitride, can be further formed on the junctions 100a. Since the passivation layer 100b, including silicon nitride, is further formed on the junctions 100a after the first thermal treatment process is performed, the diffusion of the impurities from the junctions 100a can be prevented more efficiently. Here, in order to accelerate the activation of the impurity, any one of a soak type RTP apparatus of a sec (second) unit and a laser type or flash type RTP apparatus of an msec or nsec unit can be used. Alternatively, the apparatuses may be used in combination.

The soak type, laser type and flash type RTP apparatus can be used to raise or cool the temperature within a very short time when compared with a general RTP apparatus and, therefore, can be used to raise up to high temperature when compared with a general RTP apparatus. For example, in the case in which the soak type RTP apparatus is used, the temperature can reach up to 900 to 1000 degrees Celsius. If the laser type or flash type RTP apparatus is used, the temperature can reach up to 1200 to 1400 degrees Celsius and then cooled. Here, at the time of cooling, $N_2$ ambient is used within the chamber in order to improve the electrical characteristics of the junctions 100a.

Figure 1D:
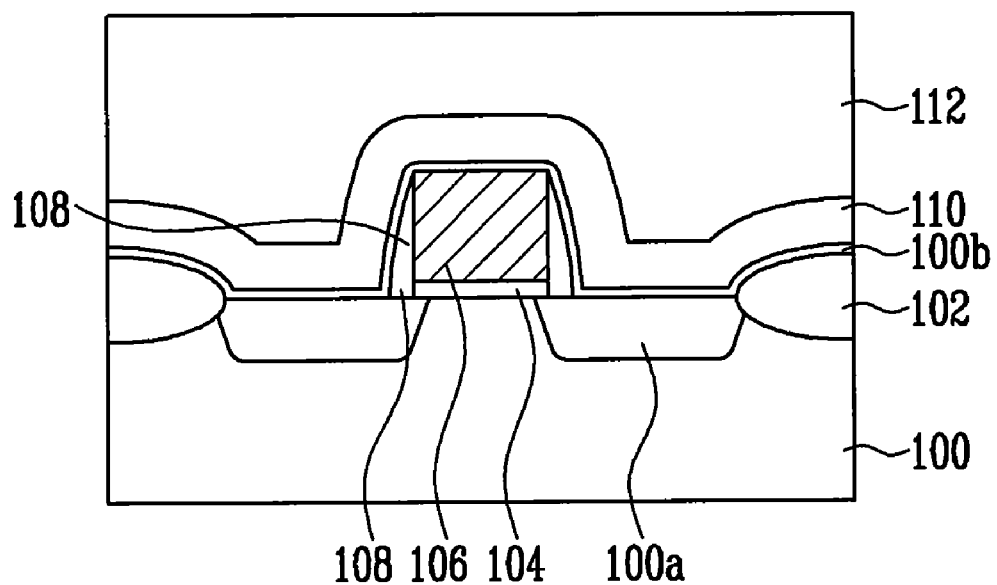

Referring to FIG. 1D, a first insulating layer 110 for a pre-metal dielectric layer is formed on the entire surface including the isolation layers 102, the gate electrode 106, the spacer layer 108 and the junctions 100a. A second insulating layer 112 for a pre-metal dielectric layer is formed on the first insulating layer 112. For example, the first insulating layer 110 can be formed from a middle temperature oxide (MTO) layer. The second insulating layer 112 can be formed from a boro-phospho-silicate glass (BPSG) layer.

After the surface of the second insulating layer 112 is polished, a thermal treatment process can be performed. Although this thermal treatment process is performed, the impurities within the junctions 100a can be prevented from diffusing out by the passivation layer 100b formed on the junctions 100a. Accordingly, an increase in the sheet resistance of the junctions 100a can be prevented and therefore, the electrical characteristics of the semiconductor device can be improved.

As described above, according to the present invention, after impurities are implanted by performing an ion implantation process, an activation process is performed using a first thermal treatment process and a second thermal treatment process. The first thermal treatment process is performed in $N_2$ ambient (heating) and $NH_3$ ambient (cooling) and the second thermal treatment process is performed in $N_2$ ambient (heating and cooling). Thus, the impurities within the junctions can be prevented from being drained at the time of a subsequent thermal treatment process. Accordingly, an increase in the sheet resistance of the junctions can be prevented and, therefore, the electrical characteristics of the semiconductor device can be improved.

The embodiment disclosed herein has been proposed to allow a person skilled in the art to easily implement the present invention, and the person skilled in the part may implement the present invention in various manners. Therefore, the scope of the present invention is not limited by or to the embodiment as described above, and should be construed to be defined only by the appended claims and their equivalents.

What is claimed is:

1. A method of forming a semiconductor device, the method comprising:
   providing a semiconductor substrate having a gate and a junction on each side of the gate, the junctions having impurities;
   performing a first thermal treatment process in an environment suitable for forming a passivation layer over the junctions as the first thermal treatment process is being performed, wherein the first thermal treatment includes a heating step performed in a first ambient and a cooling step performed in a second ambient; and
   forming a pre-metal dielectric layer over the passivation layer.

2. The method of claim 1, wherein the first thermal treatment process is performed using a rapid thermal processing (RTP) in the environment, the environment including nitrogen, wherein the passivation layer is configured to prevent the impurities from diffusing out of the junctions.

3. The method of claim 1, wherein the heating step includes raising a temperature within the chamber at an increment of 50 to 150 degrees Celsius/sec while supplying $N_2$ gas into the chamber.

4. The method of claim 3, wherein the $N_2$ gas is supplied at a flow rate of 1 to 40 slpm.

5. The method of claim 1, wherein the heating step includes raising a temperature within the chamber up to 200 to 500 degrees Celsius while supplying $N_2$ gas into the chamber.

6. The method of claim 5, wherein the $N_2$ gas is supplied at a flow rate of 1 to 40 slpm.

7. The method of claim 1, wherein the cooling step includes cooling a temperature within the chamber by 20 to 100 degrees Celsius/sec while supplying $NH_3$ gas into the chamber.

8. The method of claim 7, wherein the $NH_3$ gas is supplied at a flow rate of 1 to 10 slpm.

9. The method of claim 1, wherein the junctions are formed by implanting P-type impurities into the semiconductor substrate, the method further comprising:
   performing a second thermal treatment process in another environment after performing the first thermal treatment, the second thermal treatment increasing a thickness of the passivation layer,
   wherein the pre-metal dielectric layer is formed over the passivation layer that has been thickened by the second thermal treatment process.

10. The method of claim 9, wherein the impurities include 11B or 49BF$_2$ ions, wherein the junctions are ultra-shallow junctions.

11. The method of claim 10, wherein the impurities include 11B ions and the impurities are provided within the junctions using implantation energy of no more than 5 KeV.

12. The method of claim 10, wherein the impurities include 49BF$_2$ ions and the impurities are provided within the junctions using no more than 20 KeV.

13. The method of claim 10, wherein the impurities are provided in the junctions using an implantation step, wherein the implantation process provides the junctions with an impurity concentration of $1 \times 10^{15}$ ions/cm$^2$ to $3 \times 10^{15}$ ions/cm$^2$.

14. The method of claim 1, wherein the pre-metal dielectric layer is formed by stacking a middle temperature oxide (MTO) layer and a boro-phospho-silicate glass (BPSG) layer.

15. A method of forming a semiconductor device, the method comprising:
   implanting impurities into a semiconductor substrate to form ultra-shallow doped junctions;
   performing a first thermal treatment process on the semiconductor substrate to form a passivation layer over the junctions, wherein the first thermal treatment includes a heating step performed in a first ambient and a cooling step performed in a second ambient; and
   forming a pre-metal dielectric layer over the passivation layer.

16. The method of claim 15, wherein the passivation layer includes silicon nitride and the pre-metal dielectric layer includes silicon oxide.

17. The method of claim 16, wherein the first thermal treatment process is performed using a rapid thermal processing (RTP).

18. The method of claim 15, wherein the heating step includes raising a temperature of the environment at a step of 50 to 150 degrees Celsius/sec while supplying $N_2$ gas into the environment.

19. The method of claim 15, wherein the heating step includes raising a temperature of the environment up to 200 to 500 degrees Celsius while supplying $N_2$ gas to the environment.

20. The method of claim 15, wherein the cooling step includes cooling a temperature of the environment by 20 to 100 degrees Celsius/sec while supplying $NH_3$ gas to the environment.

21. The method of claim 15, further comprising:
performing a second thermal treatment process after the first thermal treatment process, the second thermal treatment process involving a spike RTP.

22. The method of claim 21, wherein the environment is a process chamber, wherein the spike RTP includes raising a temperature within the chamber up to 1000 to 1100 degrees Celsius at a step of 150 to 250 degrees Celsius while supplying $N_2$ gas into the chamber at a flow rate of 1 to 40 slpm.

23. The method of claim 22, wherein the spike RTP includes cooling the temperature within the chamber in $N_2$ ambient.

24. The method of claim 15, wherein the implanting step involves implanting 11B ions by using no more than 5 KeV.

25. The method of claim 15, wherein the implanting step involves implanting 49$BF_2$ ions by using no more than 20 KeV.

26. The method of claim 15, wherein the pre-metal dielectric layer is formed by stacking a middle temperature oxide (MTO) layer and a boro-phospho-silicate glass (BPSG) layer.

27. A method of forming junctions of a semiconductor device, the method comprising:
implanting impurities into a semiconductor substrate to form ultra-shallow junctions using implantation energy of no more than 20 KeV;
performing a first thermal treatment process on the substrate within an environment including nitrogen, the first thermal treatment process causing a passivation layer to be formed on the junctions;
performing a second thermal treatment process in an environment including nitrogen after performing the first thermal treatment process; and
forming a pre-metal dielectric layer over the passivation layer after performing the second thermal treatment process.

28. The method of claim 27, wherein the first thermal treatment process involves a rapid thermal process (RTP), the first thermal treatment process including a heating step that raises a temperature of the environment at a step of 50 to 150 degrees Celsius/sec while supplying $N_2$ gas into the environment.

29. The method of claim 28, wherein the heating step includes raising a temperature of the environment up to 200 to 500 degrees Celsius.

30. The method of claim 28, wherein the first thermal treatment process includes a cooling step that cools a temperature of the environment by 20 to 100 degrees Celsius/sec while supplying $NH_3$ gas into the environment.

31. The method of claim 27, wherein the second thermal treatment process is performed using a RTP, the second thermal treatment process including sequentially performing a heating step and a cooling step.

32. The method of claim 31, wherein the heating step includes providing $N_2$ gas into the environment and raising a temperature of the environment at a step of 50 to 80 degrees Celsius/sec.

33. The method of claim 32, wherein the heating step raises the temperature of the environment up to 750 to 850 degrees Celsius.

34. The method of claim 31, wherein the cooling step in $N_2$ ambient.

* * * * *